(12) United States Patent
Hsieh et al.

(10) Patent No.: US 10,096,832 B2
(45) Date of Patent: Oct. 9, 2018

(54) PREPARATION METHOD OF BATTERY COMPOSITE MATERIAL AND PRECURSOR THEREOF

(71) Applicant: Advanced Lithium Electrochemistry Co., Ltd., Toayuan, Taoyuan County (TW)

(72) Inventors: Han-Wei Hsieh, Taoyuan (TW); Hsiang-Pin Lin, Taoyuan (TW); Chen-Tsung Hung, Taoyuan (TW)

(73) Assignee: ADVANCED LITHIUM ELECTROCHEMISTRY CO., LTD., Taoyuan (TW)

( * ) Notice: Subject to any disclaimer, the term of this patent is extended or adjusted under 35 U.S.C. 154(b) by 438 days.

(21) Appl. No.: 14/889,420

(22) PCT Filed: May 8, 2014

(86) PCT No.: PCT/CN2014/077082
§ 371 (c)(1),
(2) Date: Nov. 5, 2015

(87) PCT Pub. No.: WO2014/180334
PCT Pub. Date: Nov. 13, 2014

(65) Prior Publication Data
US 2016/0087277 A1    Mar. 24, 2016

Related U.S. Application Data

(60) Provisional application No. 61/820,935, filed on May 8, 2013.

(51) Int. Cl.
*H01M 4/58* (2010.01)
*C30B 1/10* (2006.01)
(Continued)

(52) U.S. Cl.
CPC .......... *H01M 4/5825* (2013.01); *C01B 25/45* (2013.01); *C30B 1/10* (2013.01); *C30B 29/14* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2009/0220858 A1* | 9/2009 | Cheng | C01G 23/002 429/220 |
| 2009/0233096 A1* | 9/2009 | Schall | B82Y 30/00 428/402 |
| 2010/0181529 A1* | 7/2010 | Huang | H01M 4/5825 252/182.1 |

FOREIGN PATENT DOCUMENTS

| | | |
|---|---|---|
| CN | 102249208 | 11/2011 |
| CN | 102781827 | 11/2012 |

(Continued)

OTHER PUBLICATIONS

Maja Pivko et al., Synthesis of Nanometric LiMnPO4 via a Two-Step Technique, Chemistry of Materials, 2012, pp. 1041-1047, vol. 24, National Institute of Chemistry, Ljubljana, Slovenia.

*Primary Examiner* — Erin F Bergner
(74) *Attorney, Agent, or Firm* — Kirton McConkie; Evan R. Witt

(57) ABSTRACT

A preparation method of a battery composite material includes steps of providing phosphoric acid, a first metal source, a second metal source and water, processing a reaction of the first metal source, the second metal source, the phosphoric acid and the water to produce a first product, calcining the first product to produce a first precursor or a second precursor, among which each of the first precursor and the second precursor is a solid-solution containing first (Continued)

metal and second metal, and processing a reaction of the first precursor or the second precursor, and a first reactant to obtain a reaction mixture, and then calcining the reaction mixture to produce the battery composite material. As a result, the battery product has two stable charging and discharging platforms, such that the present invention achieves the advantages of enhancing the stability and the electric performance.

10 Claims, 18 Drawing Sheets

(51) Int. Cl.
  *C30B 29/14* (2006.01)
  *C01B 25/45* (2006.01)
(52) U.S. Cl.
  CPC ...... *C01P 2002/72* (2013.01); *C01P 2004/03* (2013.01); *C01P 2004/04* (2013.01); *C01P 2006/40* (2013.01)

(56) References Cited

FOREIGN PATENT DOCUMENTS

| | | |
|---|---|---|
| CN | 102791625 | 11/2012 |
| JP | 2000007311 A | 1/2000 |
| JP | 2001082083 A | 3/2001 |
| JP | 2007284271 A | 11/2007 |
| JP | 2009295465 A | 12/2009 |
| JP | 2012012279 A | 1/2012 |
| JP | 2012195157 A | 10/2012 |
| JP | 2014524123 A | 9/2014 |
| KR | 10-0805910 | 1/2008 |
| TW | 201305046 | 2/2013 |
| WO | 2004036672 A1 | 4/2004 |
| WO | 2011111628 A1 | 9/2011 |
| WO | 2012006725 A1 | 1/2012 |
| WO | 2013010505 | 1/2013 |

\* cited by examiner

PREPARATION METHOD OF BATTERY COMPOSITE MATERIAL AND PRECURSOR THEREOF

TECHNICAL FIELD

The present disclosure relates to a preparation method, and more particularly to a preparation method of a battery composite material and a precursor thereof.

BACKGROUND

Due to the sustained global energy shortage, the price of oil becomes higher and the environmental consciousness rises day by days. The most popular subject of the energy industry is how to provide a clean and effective energy. In a variety of alternative energies, the chemical battery is the most actively developing technology. With continued investment in research and development of related industries, the chemical battery technology is not only continuously improved and enhanced, but also widely used in our daily life, such as consuming electronics, medical equipment, electric bicycles, electric motorcycles, electric cars and electric buses.

Particularly, the Lithium Metal Phosphate ($LiMPO_4$, among which M may be any metal, e.g. Fe, Co, Mn) composite batteries are widely accepted by the market because of the large current and long life cycle. Also, the Lithium Metal Phosphate composite batteries have no risk of explosion and have the advantages of high power efficiency and low pollution so as to be used in replace of the conventional lead-acid, nickel-metal hydride and nickel-cadmium batteries. After years of research, the Lithium Metal Phosphate Nano-Co-crystalline Olivine (hereinafter referred as "LMP-NCO") battery is developed. The LMP-NCO battery is a single compound consisting Li, P and metals or precursor of metal composition, and is a non-coated and non-doped material, so that the LMP-NCO battery can significantly improve the power conductivity and eliminate impurities. Moreover, the price of the LMP-NCO battery is lower than conventional lithium metal phosphate materials, in which the LMP-NCO battery has higher market competitiveness and becomes the main product of the industry.

In general, lithium ferric phosphate and lithium manganese phosphate are commonly applied to the preparation methods of LMP-NCO and the battery composite materials prepared with the preparation methods. However, a lack of stability of the manufacturing processes is caused by the reduction-oxidation reactions, hence the difficulty of the manufacturing processes is increased. Moreover, the agglomeration effects are prone to be occurred between compounds, such that the product size cannot meet the practical demands, and the performance of the battery cannot be as good as expected.

There is a need of providing a preparation method of a battery composite material and a precursor thereof to obviate the drawbacks encountered from the prior art.

BRIEF SUMMARY

It is an object of the present invention to provide a preparation method of a battery composite material and a precursor thereof in order to eliminate the drawbacks of the unstable manufacturing processes, the difficulty of the manufacturing processes, and the bad performance of the battery caused by that the product size cannot meet the practical demands.

An object of the present invention provides a preparation method of a battery composite material and a precursor thereof for reducing the number of times of reduction-oxidation reactions in manner of preparing the battery composite material through the precursor produced via reactions, so that the stability of the manufacturing processes is enhanced, and the difficulty of the manufacturing processes is reduced.

Another object of present invention provides a preparation method of a battery composite material and a precursor thereof. By preparing a solid-solution including first metal and second metal as a precursor for finally producing a battery composite material, the battery composite material and the battery product have two stable charging and discharging platforms, such that the advantages of enhancing the stability and the electric performance are achieved.

In accordance with an aspect of the present disclosure, there is provided a preparation method of a battery composite material. The preparation method includes steps of providing phosphoric acid, a first metal source, a second metal source and water, among which the formula of the phosphoric acid is written by $H_3PO_4$, processing a reaction of the first metal source, the second metal source, the phosphoric acid and the water to produce a first product, calcining the first product to produce a first precursor or a second precursor, among which each of the first precursor and the second precursor is a solid-solution containing first metal and second metal, and processing a reaction of the first precursor or the second precursor, and a first reactant to obtain a reaction mixture, and then calcining the reaction mixture to produce the battery composite material.

In accordance with another aspect of the present disclosure, there is provided a preparation method of a precursor of a battery composite material. The preparation method includes steps of processing a reaction of first metal and second metal and a compound releasing phosphate ions in a solution to produce a first product, and performing a thermal treatment to the first product to produce a precursor, among which the precursor is a solid-solution containing the first metal and the second metal.

In accordance with still another aspect of the present disclosure, there is provided a preparation of a battery composite material. The preparation method at least includes steps of processing a reaction of a precursor, the formula of which is written by $(Mn_xFe_{1-x})_2P_2O_7$, and at least a first reactant and calcining a reaction mixture of the reaction to produce the battery composite material, among which the battery composite material is lithium ferric manganese phosphate or lithium ferric manganese phosphate nano-co-crystalline olivine, wherein the formula of lithium ferric manganese phosphate is written by $LiMn_xFe_{1-x}PO_4$, $x>0$.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
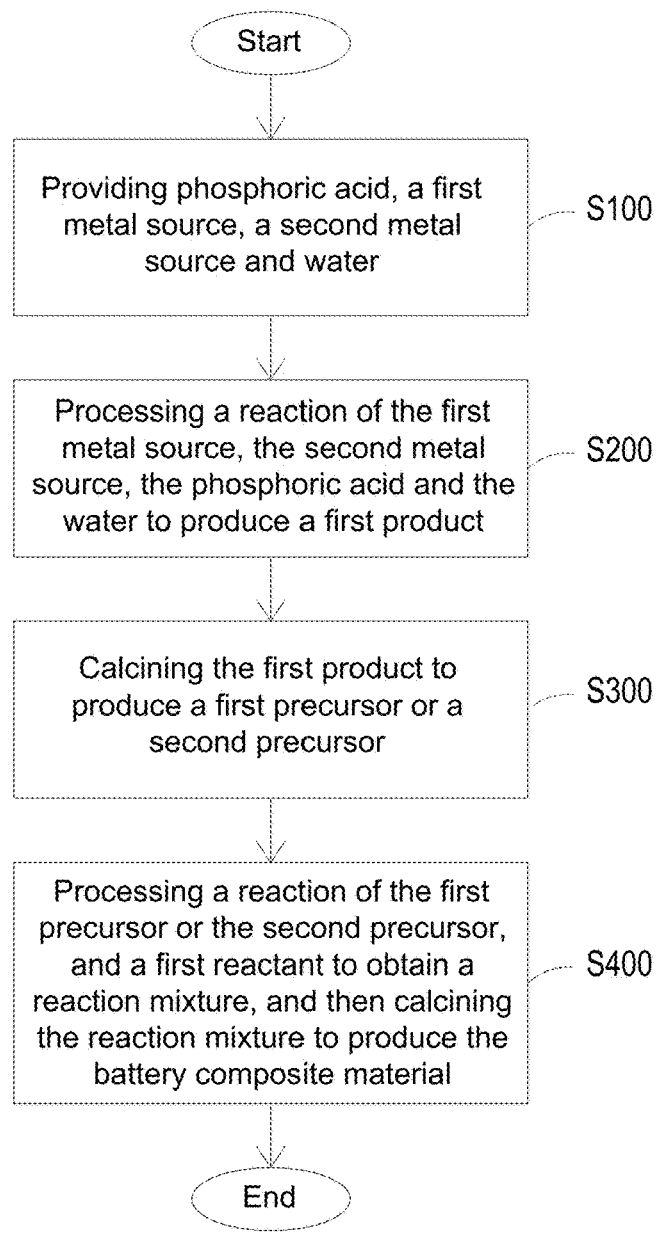
FIG. 1 schematically illustrates the flow chart of a preparation method of a battery composite material according to an embodiment of the present invention.

Please refer to FIG. 1. FIG. 1 schematically illustrates the flow chart of a preparation method of a battery composite material according to an embodiment of the present invention. A preparation method of a batter composite material of the present invention includes steps as follows. At first, providing phosphoric acid, a first metal source, a second metal source and water as shown in step S100, among which the formula of the phosphoric acid is written by $H_3PO_4$. In some embodiments, the first metal source and the second metal source are respectively selected from at least one of ferric source, manganese source, cobalt source and nickel source, and are preferred to be ferric source and manganese source, respectively.

Figure 2:
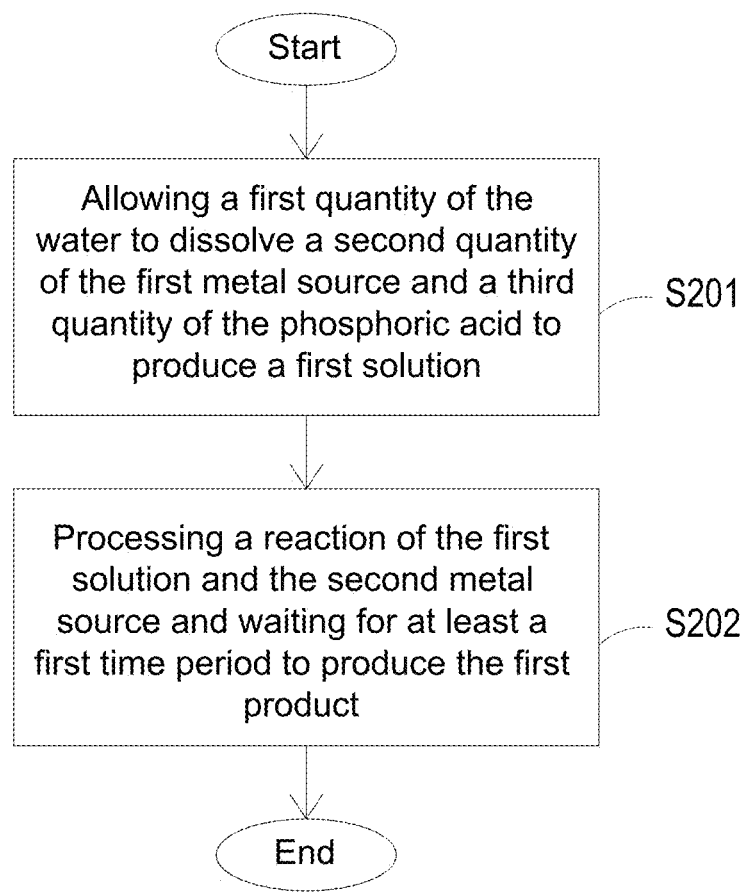
FIG. 2 schematically illustrates a detailed flow chart of the preparation method of a battery composite material according to an embodiment of the present invention.

Next, processing a reaction of the first metal source, the second metal source, the phosphoric acid and the water to produce a first product as shown in step S200. In some embodiments, the step S200 is preferred to include two sub-steps. Please refer to FIG. 2 simultaneously. FIG. 2 schematically illustrates a detailed flow chart of the preparation method of a battery composite material according to an embodiment of the present invention. As shown in FIG. 1 and FIG. 2, the detailed flow chart of the step S200 includes a first sub-step of allowing a first quantity of the water to dissolve a second quantity of the first metal source and a third quantity of the phosphoric acid to produce a first solution as shown in step S201, and a second sub-step processing a reaction of the first solution and the second metal source and waiting for at least a first time period to produce the first product as shown in step S202. In this embodiment, the first time period is for example 8 hours, but not limited thereto. Additionally, the weight ratio of first metal of the second quantity to phosphor of the third quantity is 1:1. That is, by adjusting the ratio of the second quantity to the third quantity, the first metal and the phosphor may have the same quantity for fully reacted in the coming steps to completely produce the first product. Moreover, according to the conception of the present invention, the first product can be produced by a reaction of first metal and second metal and a compound releasing phosphate ions in a solution, but not limited herein.

Figure 3:
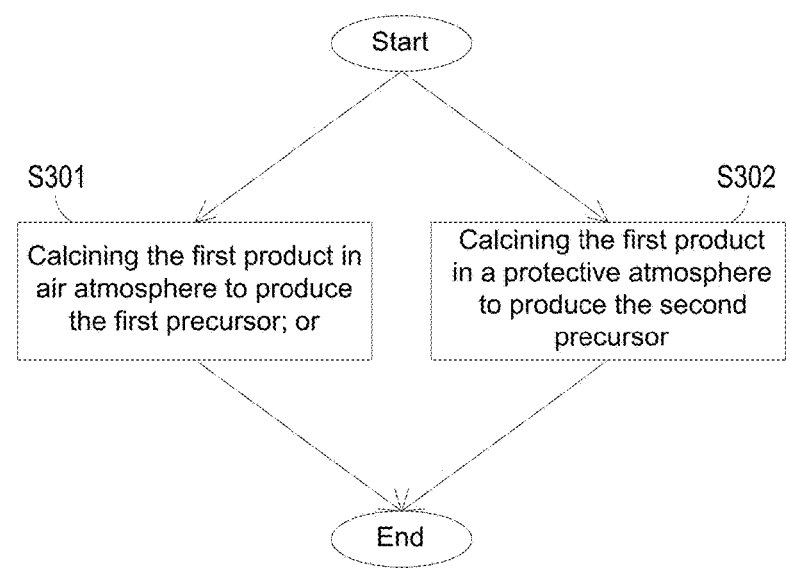
FIG. 3 schematically illustrates another detailed flow chart of the preparation method of a battery composite material according to an embodiment of the present invention.

Then, calcining the first product obtained in the step S200 to produce a first precursor or a second precursor as shown in step S300, among which each of the first precursor and the second precursor is a solid-solution containing first metal and second metal, and is preferred to be applied to prepare the lithium-ion anode battery composite material with olivine crystalline structure. For example, the second precursor is ferric manganese pyrophosphate, and the formula of ferric manganese pyrophosphate is written by $(Mn_xFe_{1-x})_2P_2O_7$, but not limited thereto. In addition, in some embodiments, the step S300 further includes sub-steps. Please refer to FIG. 1 and FIG. 3 simultaneously. FIG. 3 schematically illustrates another detailed flow chart of the preparation method of a battery composite material according to an embodiment of the present invention. As shown in FIG. 1 and FIG. 3, the step S300 of the preparation method of the battery composite material of the present invention further includes sub-steps S301 and S302. The step S300 is practically implemented by selectively performing one of the sub-steps S301 and S302. The step S301 is a step of calcining the first product in air atmosphere to produce the first precursor, and the step S302 is a step of calcining the first product in a protective atmosphere to produce the second precursor. In other words, the difference between the step S301 and the step S302 is that the thermal treatment of the first product is implemented in air atmosphere in step S301, and the thermal treatment of the first product is implemented in a protective atmosphere, such as a nitrogen atmosphere or an argon atmosphere, in step S302.

Finally, as shown in step S400, processing a reaction of the first precursor or the second precursor, and a first reactant to obtain a reaction mixture, and then calcining the reaction mixture to produce the battery composite material. The battery composite material is for example lithium ferric manganese phosphate or lithium ferric manganese phosphate nano-co-crystalline olivine, the formula of lithium ferric manganese phosphate is written by $LiMn_xFe_{1-x}PO_4$, x>0. Preferably, x is greater than or equal to 0.5, and is less than or equal to 0.95, such that the battery composite material has a better electric performance. It should be noted that the first precursor or the second precursor is reacted with "at least" the first reactant in the step S400. Certainly, the first precursor or the second precursor is not limited to be reacted only with the first reactant, or be reacted with the first reactant and other reactants.

Figure 4:
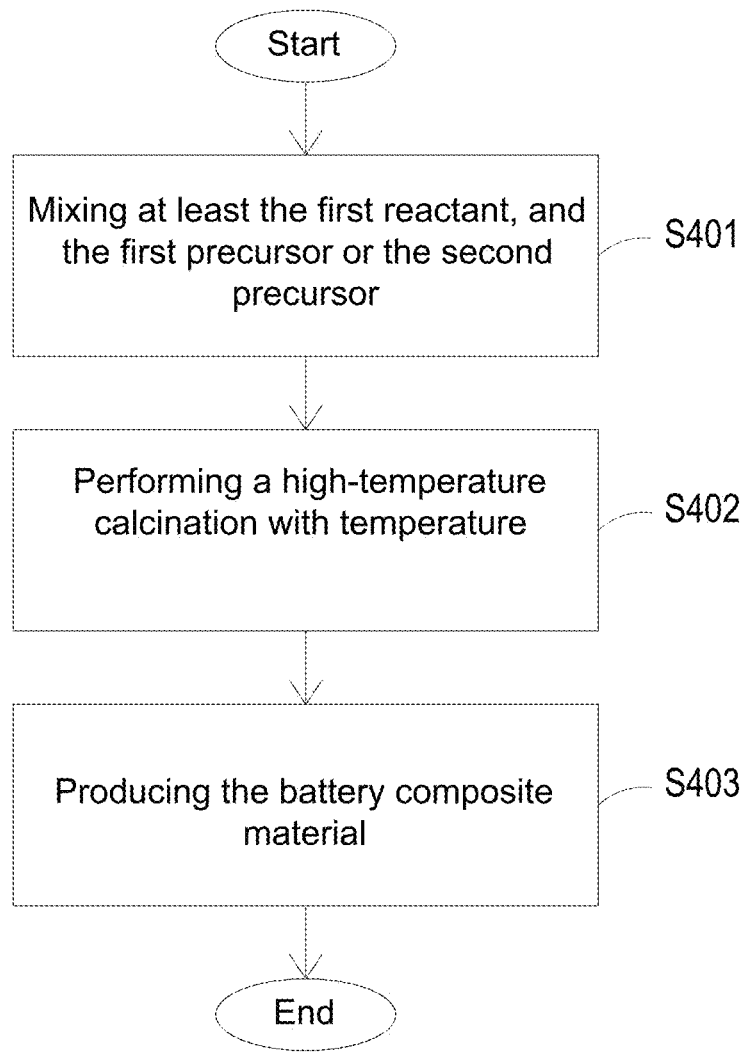
FIG. 4 schematically illustrates another detailed flow chart of the preparation method of a battery composite material according to an embodiment of the present invention.

Please refer to FIG. 1 and FIG. 4. FIG. 4 schematically illustrates another detailed flow chart of the preparation method of a battery composite material according to an embodiment of the present invention. As shown in FIG. 1 and FIG. 4, the step S400 of the preparation method of the battery composite material of the present invention further includes sub-steps as following. At first, as shown in step S401, mixing at least a first reactant, and the first precursor or the second precursor, among which the first reactant is lithium carbonate, a compound containing lithium, or a mixture of several compounds containing lithium. Next, as shown in step S402, performing a high-temperature calcination (e.g. greater than 500° C.). Finally, as shown in step S403, producing the battery composite material, such as lithium ferric manganese phosphate or lithium ferric manganese phosphate nano-co-crystalline olivine.

In the step S200 or the step S400, metal oxide, such as $V_2O_5$, $TiO_2$ or MgO, can be added into the reaction, so that a $LiMn_xFe_{1-x}PO_4$-like material containing the metal oxide, which can be called or named "lithium ferric manganese phosphate nano-co-crystalline olivine (LFMP-NCO)", is produced.

Under this circumstance, the present invention provides a preparation method of a battery composite material for reducing the number of times of reduction-oxidation reactions in manner of preparing the battery composite material through the precursor produced via reactions, so that the stability of the manufacturing processes is enhanced, and the difficulty of the manufacturing processes is reduced.

The following embodiments are presented herein for purpose of illustration and description of the preparation method of the battery composite material of the present disclosure.

1st Embodiment

Figure 5A:
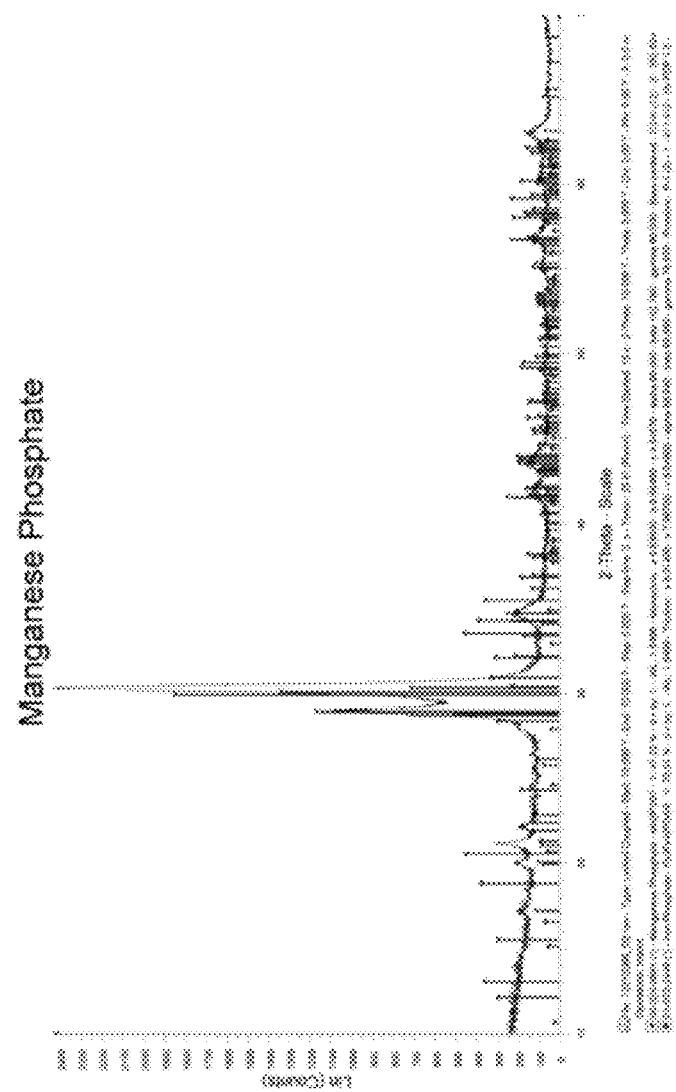
FIG. 5A schematically illustrates the X-ray diffraction analysis diagram of a precursor prepared in air atmosphere by the preparation method of the battery composite material of the present invention.
Figure 5B:
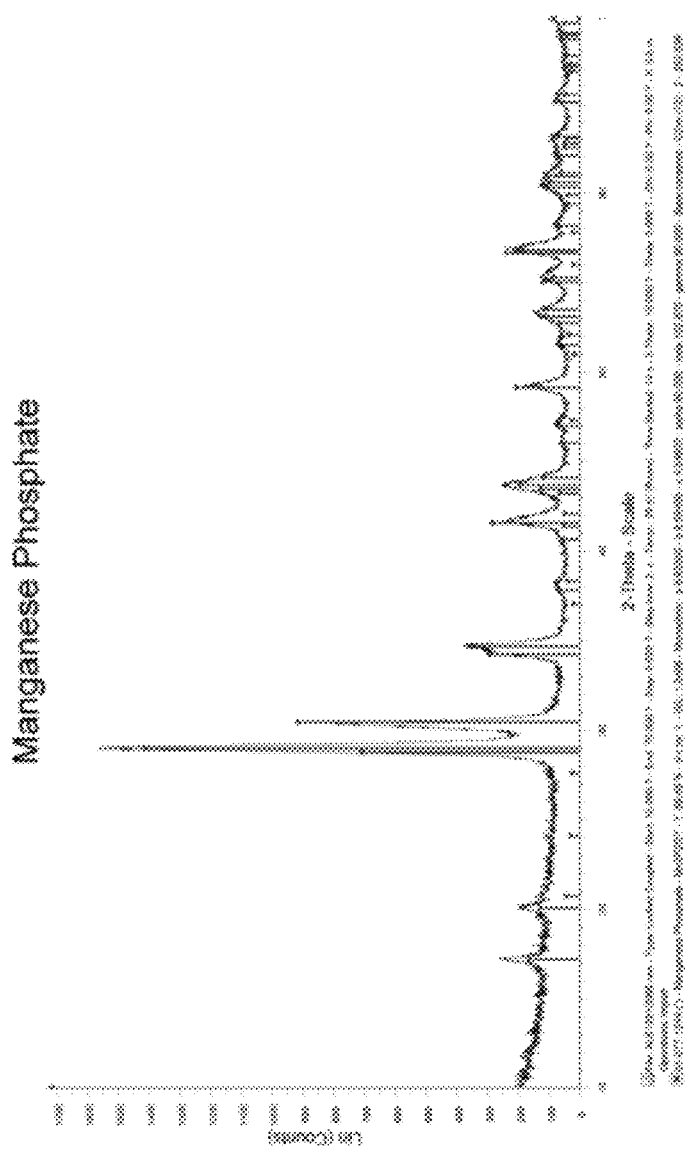
FIG. 5B schematically illustrates the X-ray diffraction analysis diagram of a precursor prepared in a protective atmosphere by the preparation method of the battery composite material of the present invention.

At first, providing 904.9 grams of $Fe_7(PO_4)_6$, 2772.7 grams of phosphoric acid (Purity>85%), 5.0 liters of deionized water and manganese source, mixing $Fe_7(PO_4)_6$ and the deionized water as a first metal source or a secondary metal source, and then adding the phosphoric acid to process a reaction and stirring. Next, adding the manganese source as a second metal source or a primary metal source and waiting for at least 8 hours to fully process a reaction to produce a precursor solution. Then, calcining the precursor solution in air atmosphere or a protective atmosphere (e.g. nitrogen atmosphere or argon atmosphere) with temperature greater than 400° C. The calcined compounds in air atmosphere and in the protective atmosphere are analyzed in manner of X-ray diffraction, and the analysis diagrams are respectively shown as FIG. 5A and FIG. 5B. After comparing the diagrams with JCPDS card, the first precursor is confirmed to be a solid-solution containing Mn and Fe, the structure of the first precursor is similar with $Mn_2P_2O_7$, and the structure of a second precursor is also similar with $Mn_2P_2O_7$. However, in the first precursor and the second precursor, Mn is replaced by Fe. The first precursor and the second precursor can be written by $(Mn_x,Fe_{1-x})_2P_2O_7$. The ratio of Mn to Fe can be obtained through stoichiometry. The precursors are $(Mn_{0.73}Fe_{0.27})_2P_2O_7$.

Figure 6A:
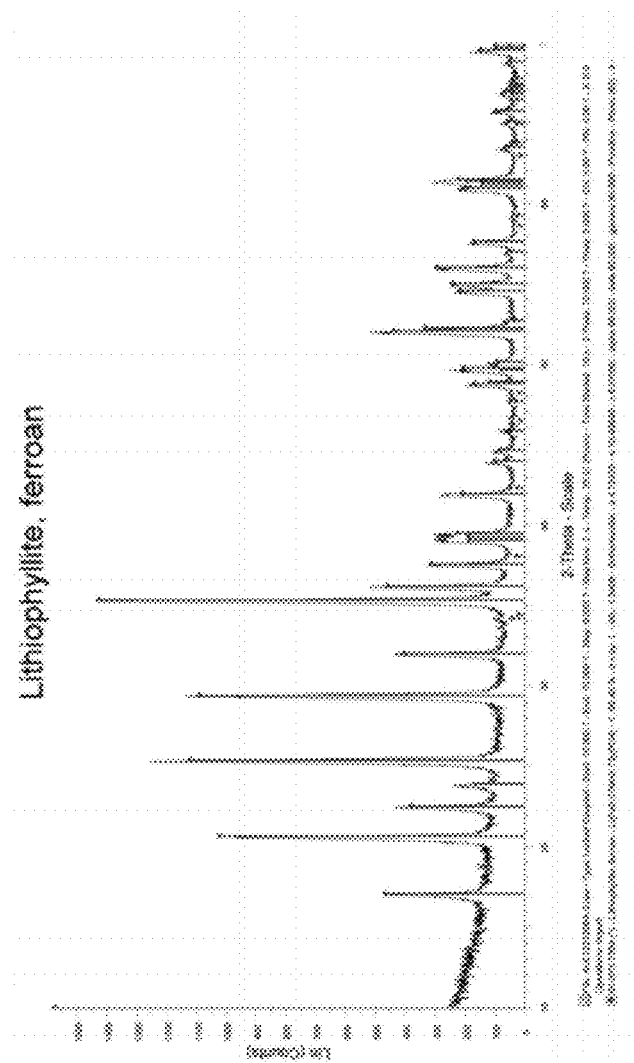
FIG. 6A schematically illustrates the X-ray diffraction analysis diagram of a battery composite material prepared by the preparation method of the battery composite material of the present invention with the first precursor.
Figure 6B:
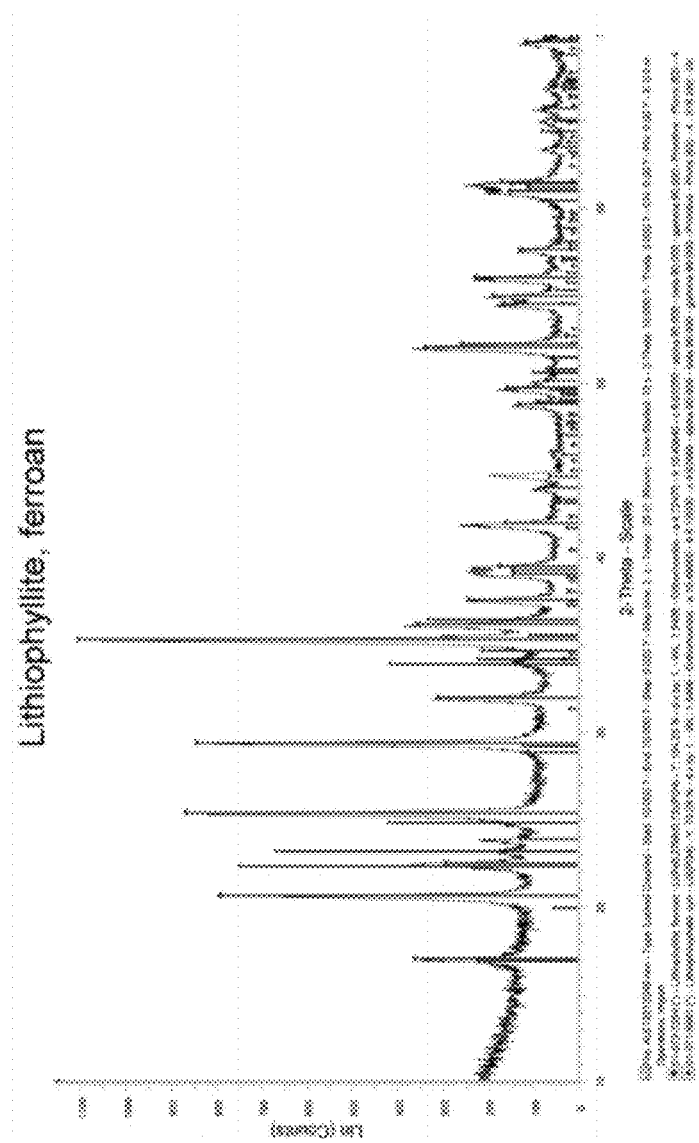
FIG. 6B schematically illustrates the X-ray diffraction analysis diagram of a battery composite material prepared by the preparation method of the battery composite material of the present invention with the second precursor.

Next, take the preparation of 18 molecules of lithium ferric manganese phosphate for example. Adding 2059.6 grams of the first precursor or the second precursor obtained in the above-mentioned steps and 755 to 792.7 grams of lithium hydroxide (i.e. LiOH) into 10 liters of pure water to process a reaction, and then adding the appropriate carbon source. Performing a high-temperature calcination with temperature greater than 500° C. to the product of reaction. The calcined compounds are analyzed in manner of X-ray diffraction, and the analysis diagrams are respectively shown as FIG. 6A and FIG. 6B. After comparing the diagrams with JCPDS card, the compounds are confirmed to be lithium ferric manganese phosphate (i.e. $LiMn_xFe_{1-x}PO_4$). The ratio of Mn to Fe can be obtained through stoichiometry. The compounds are $LiMn_{0.73}Fe_{0.27}PO_4$.

Figure 7A:
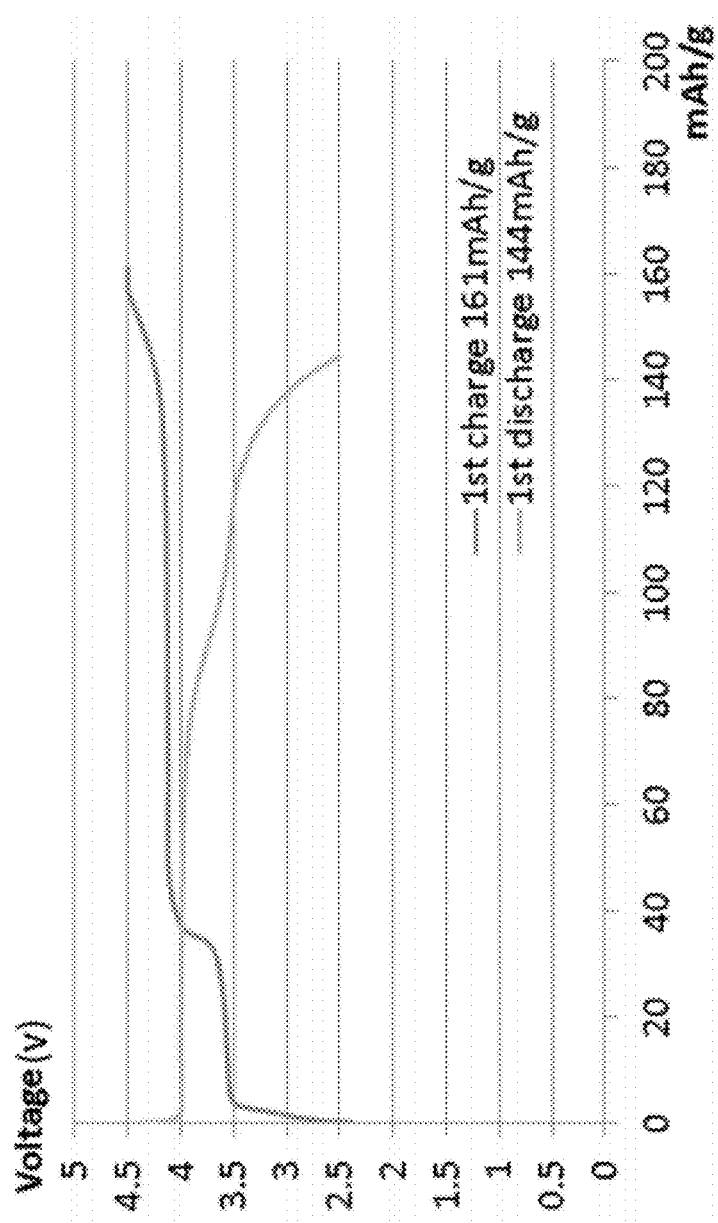
FIG. 7A schematically illustrates a charging and discharging characteristic diagram of a cell battery made of a battery composite material prepared by the preparation method of the battery composite material of the present invention.

Next, mixing $LiMn_{0.73}Fe_{0.27}PO_4$ obtained in the above-mentioned steps, conductive material Super P and 4 weight percent of binder (PVDF+NMP) in a ratio of 8.5:0.5:1. First, mixing 0.5 grams of conductive carbon black (Super P) and 25 grams of binder (PVDF:NMP=40:960) for 10 minutes. The rotational speed is 1200 rpm. Then, adding 8.5 grams of $LiMn_{0.73}Fe_{0.27}PO_4$ and mixing for another 10 minutes. Next, coating the dispersed slurry on an aluminum substrate with a blade coater, among which the coating thickness is 0.3 millimeters. Then, putting the coated aluminum substrate into an oven and baking the coated aluminum substrate at 110° C. for 1 hour. Finally, forming the aluminum substrate as a circular plate, among which the diameter of the circular plate is 1.3 centimeters, and making a coin-cell battery with this circular plate, lithium metal (as the negative electrode), 1 molar concentration of $LiPF_6$ and a mixed electrolyte of EC and DMC (volume ratio=3:7). The electric characteristics of charging and discharging of the coin-cell battery are tested and analyzed through a charging and discharging machine. The test and the analysis are performed at 0.1 coulombs for two cycles and 2 coulombs for two cycles. The charging and discharging characteristic diagram is shown as FIG. 7A. The cutoff voltages of charging and discharging of the coin-cell battery are respectively 2.5 and 4.5 volts.

2nd Embodiment

Figure 7B:
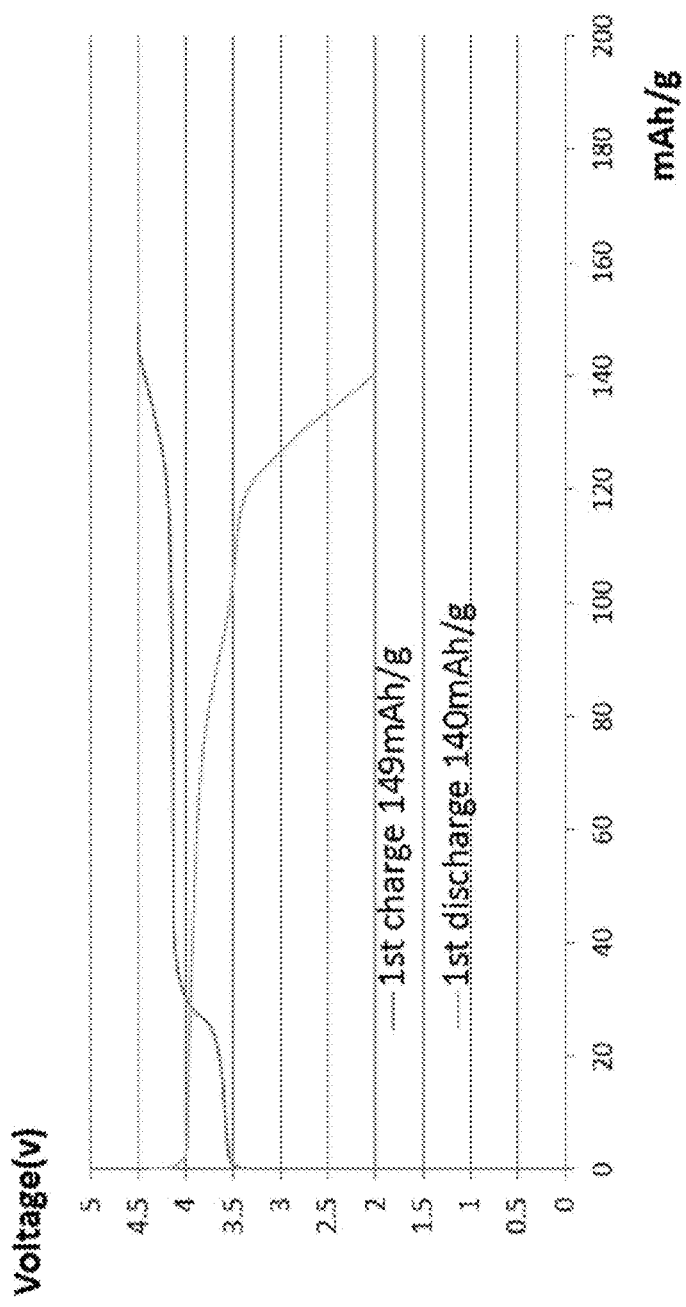
FIG. 7B schematically illustrates a charging and discharging characteristic diagram of a cell battery made of another battery composite material prepared by the preparation method of the battery composite material of the present invention.

Adjusting the ratio of the ferric source to the manganese source of the first embodiment for finally obtaining the battery composite material with the ratio of Mn to Fe equal to 8:2. In other words, the battery composite material is adjusted as $LiMn_{0.8}Fe_{0.2}PO_4$. The electric characteristics of charging and discharging are tested under the same environment, and the charging and discharging characteristic diagram is shown as FIG. 7B. The rest portion of this embodiment is similar with the first embodiment, and is not redundantly described herein.

3rd Embodiment

Figure 7C:
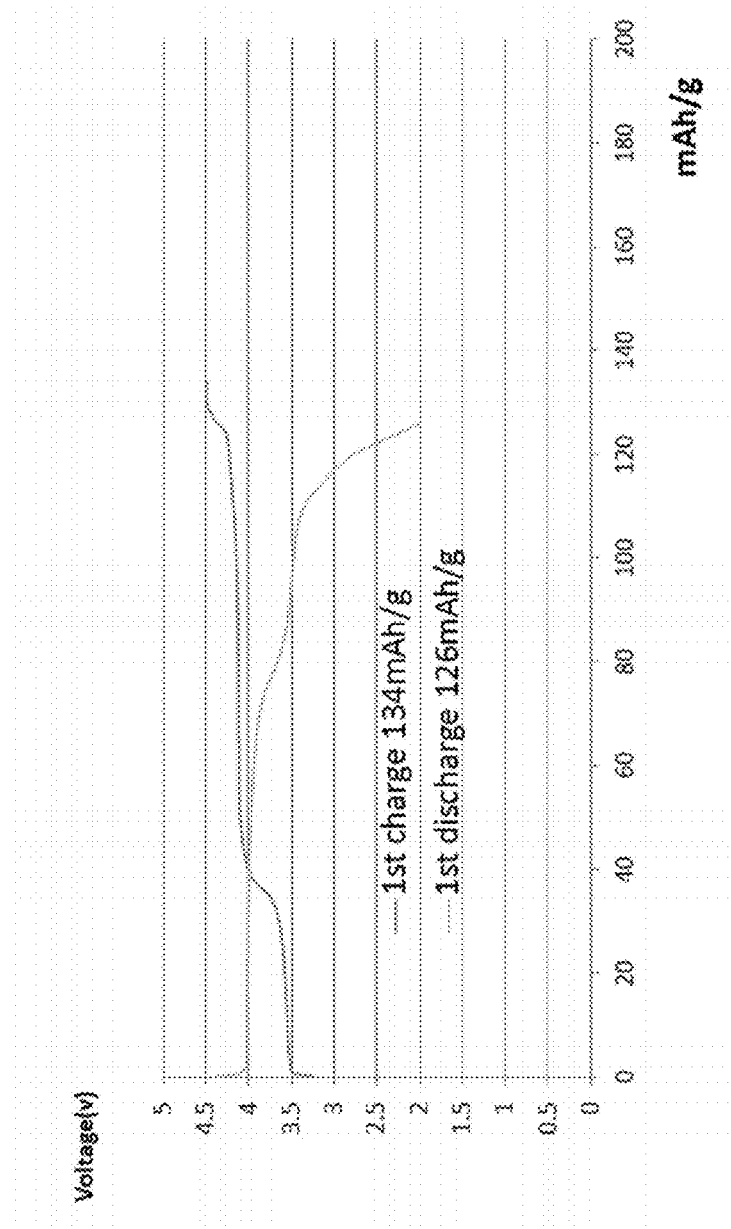
FIG. 7C schematically illustrates a charging and discharging characteristic diagram of a cell battery made of another battery composite material prepared by the preparation method of the battery composite material of the present invention.

Adjusting the ratio of the ferric source to the manganese source of the first embodiment for finally obtaining the battery composite material with the ratio of Mn to Fe equal to 85:15. In other words, the battery composite material is adjusted as $LiMn_{0.85}Fe_{0.15}PO_4$. The electric characteristics of charging and discharging are tested under the same environment, and the charging and discharging characteristic diagram is shown as FIG. 7C. The rest portion of this embodiment is similar with the first embodiment, and is not redundantly described herein.

4th Embodiment

Figure 7D:
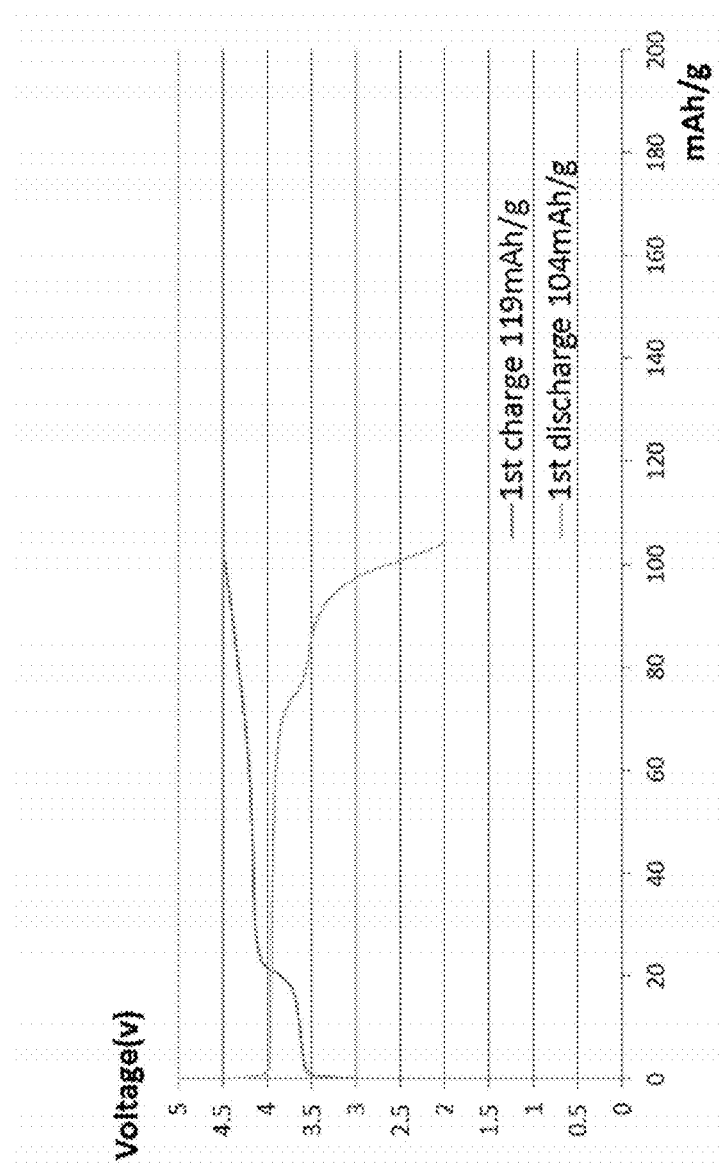
FIG. 7D schematically illustrates a charging and discharging characteristic diagram of a cell battery made of another battery composite material prepared by the preparation method of the battery composite material of the present invention.

Adjusting the ratio of the ferric source to the manganese source of the first embodiment for finally obtaining the battery composite material with the ratio of Mn to Fe equal to 9:1. In other words, the battery composite material is adjusted as $LiMn_{0.9}Fe_{0.1}PO_4$. The electric characteristics of charging and discharging are tested under the same environment, and the charging and discharging characteristic diagram is shown as FIG. 7D. The rest portion of this embodiment is similar with the first embodiment, and is not redundantly described herein.

5th Embodiment

Adding metal oxide, such as $V_2O_5$, $TiO_2$ or MgO, in the step S200 or the step S400 of the first embodiment, so that lithium ferric manganese phosphate nano-co-crystalline olivine is produced. The rest portion of this embodiment is similar with the first embodiment, and is not redundantly described herein.

6th Embodiment

At first, providing 2445.6 grams of $Fe_2(C_2O_4)_3 \cdot 5H_2O$, 3947.1 grams of phosphoric acid (Purity>85%), 5.0 liters of deionized water and manganese source, mixing $Fe_2(C_2O_4)_3 \cdot 5H_2O$ and the deionized water as a first metal source or a secondary metal source, and then adding the phosphoric acid to process a reaction and stirring. Next, adding the manganese source as a second metal source or a primary metal source and waiting for at least 8 hours to fully process a reaction to produce a precursor solution. Then, calcining the precursor solution in air atmosphere or a protective atmosphere (e.g. nitrogen atmosphere or argon atmosphere) with temperature greater than 400° C. to produce the first precursor or the second precursor.

Next, take the preparation of 18 molecules of lithium ferric manganese phosphate for example. Adding 2059.6 grams of the first precursor or the second precursor obtained in the above-mentioned steps and 755 to 792.7 grams of lithium hydroxide (i.e. LiOH) into 10 liters of pure water to process a reaction, and then adding the appropriate carbon source. Performing a high-temperature calcination with temperature greater than 500° C. to the product of reaction. The calcined compounds are analyzed in manner of X-ray diffraction and are confirmed to be lithium ferric manganese phosphate $LiMn_{0.73}Fe_{0.27}PO_4$.

7th Embodiment

At first, providing 1789 grams of $Fe(C_2H_3O_2)_2$, 3947.1 grams of phosphoric acid (Purity>85%), 5.0 liters of deionized water and manganese source, mixing $Fe(C_2H_3O_2)_2$ and the deionized water as a first metal source or a secondary metal source, and then adding the phosphoric acid to process a reaction and stirring. Next, adding the manganese source as a second metal source or a primary metal source and waiting for at least 8 hours to fully process a reaction to produce a precursor solution. Then, calcining the precursor solution in air atmosphere or a protective atmosphere (e.g. nitrogen atmosphere or argon atmosphere) with temperature greater than 400° C. to produce the first precursor or the second precursor.

Next, take the preparation of 18 molecules of lithium ferric manganese phosphate for example. Adding 2059.6 grams of the first precursor or the second precursor obtained in the above-mentioned steps and 755 to 792.7 grams of lithium hydroxide (i.e. LiOH) into 10 liters of pure water to process a reaction, and then adding the appropriate carbon source. Performing a high-temperature calcination with temperature greater than 500° C. to the product of reaction. The calcined compounds are analyzed in manner of X-ray diffraction and are confirmed to be lithium ferric manganese phosphate $LiMn_{0.73}Fe_{0.27}PO_4$.

8th Embodiment

At first, providing 821.3 grams of $Fe_2O_3$, 3947.1 grams of phosphoric acid (Purity>85%), 5.0 liters of deionized water and manganese source, mixing $Fe_2O_3$ and the deionized water as a first metal source or a secondary metal source, and then adding the phosphoric acid to process a reaction and stirring. Next, adding the manganese source as a second metal source or a primary metal source and waiting for at least 8 hours to fully process a reaction to produce a precursor solution. Then, calcining the precursor solution in air atmosphere or a protective atmosphere (e.g. nitrogen atmosphere or argon atmosphere) with temperature greater than 400° C. to produce the first precursor or the second precursor.

Next, take the preparation of 18 molecules of lithium ferric manganese phosphate for example. Adding 2059.6 grams of the first precursor or the second precursor obtained in the above-mentioned steps and 755 to 792.7 grams of lithium hydroxide (i.e. LiOH) into 10 liters of pure water to process a reaction, and then adding the appropriate carbon source. Performing a high-temperature calcination with temperature greater than 500° C. to the product of reaction. The calcined compounds are analyzed in manner of X-ray diffraction and are confirmed to be lithium ferric manganese phosphate $LiMn_{0.73}Fe_{0.27}PO_4$.

Figure 8:
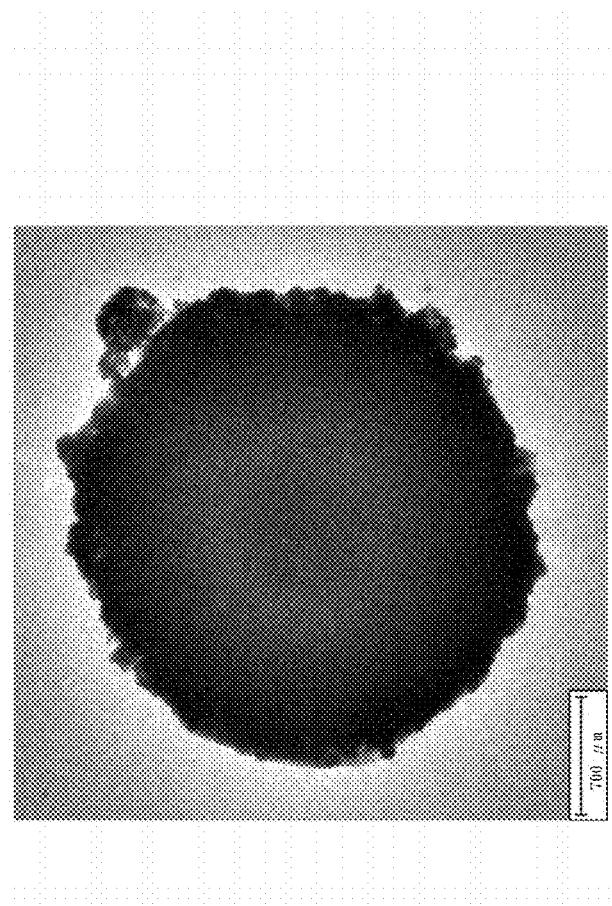
FIG. 8 schematically illustrates the TEM analysis diagram of the precursor prepared by the preparation method of the precursor of the battery composite material of the present invention.
Figure 9:
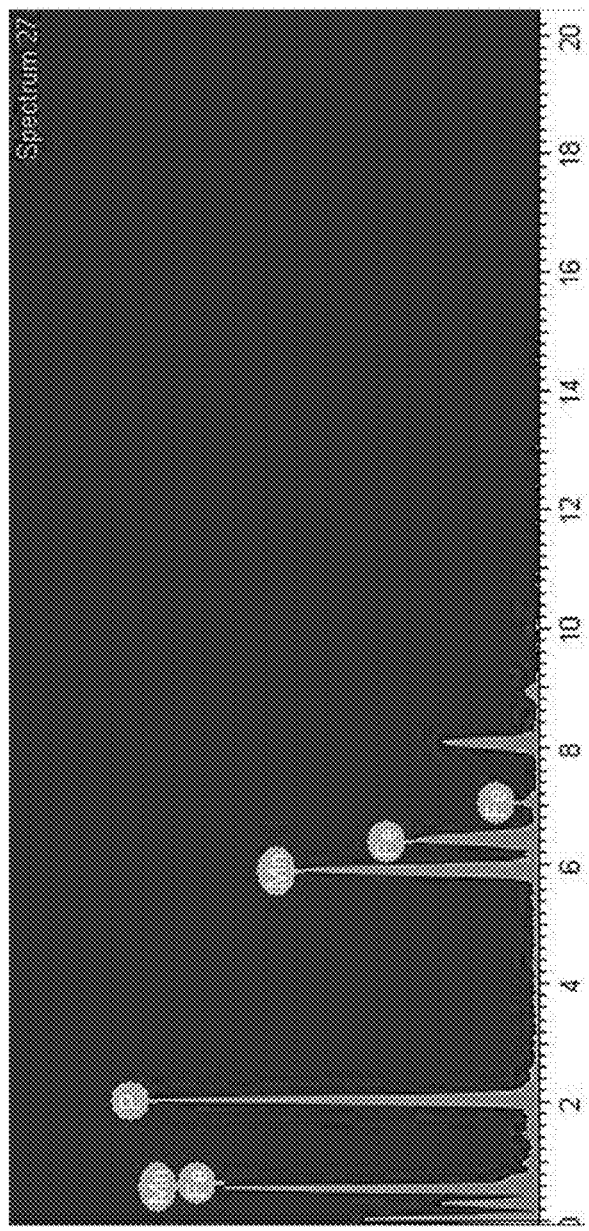
FIG. 9 schematically illustrates the EDS (stands for energy dispersive spectroscopy) analysis diagram of the precursor prepared by the preparation method of the precursor of the battery composite material of the present invention.

Please refer to FIG. 8 and FIG. 9. FIG. 8 schematically illustrates the TEM analysis diagram of the precursor prepared by the preparation method of the precursor of the battery composite material of the present invention. FIG. 9 schematically illustrates the EDS (stands for energy dispersive spectroscopy) analysis diagram of the precursor prepared by the preparation method of the precursor of the battery composite material of the present invention. As shown in FIG. 8 and FIG. 9, in the TEM analysis diagram and the EDS analysis diagram, it is shown that the precursor prepared by the preparation method of a precursor of a battery composite material of the present invention contains phosphor, ferrite and manganese (i.e. P, Fe, Mn). The formula of the precursor is verified and matched with $(Mn_xFe_{1-x})_2P_2O_7$. In addition, the ratio of Mn to Fe is analyzed in manner of EDS. The verified result illustrates that the formula of the precursor is written by $(Mn_{0.7}Fe_{0.3})_2P_2O_7$.

Figure 10A:
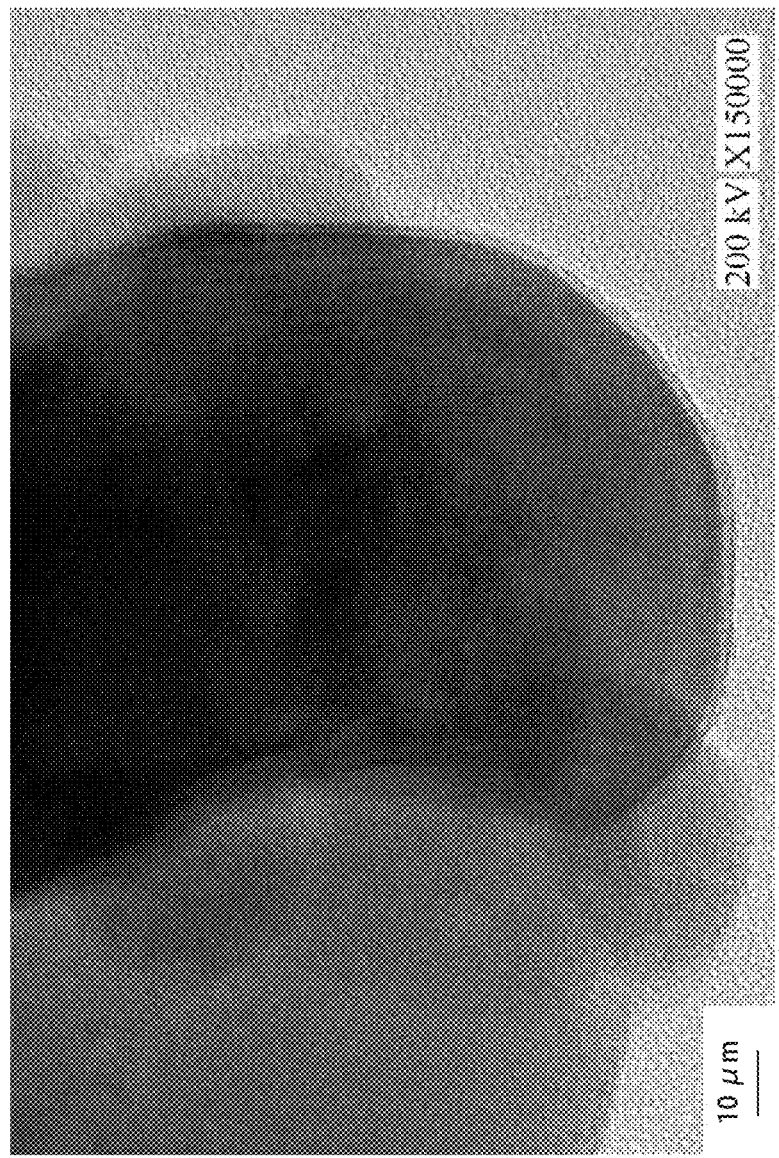
FIG. 10A and FIG. 10B schematically illustrate the TEM analysis diagram of the battery composite material prepared by further steps of the preparation method of the battery composite material of the present invention with the first precursor.
Figure 10B:
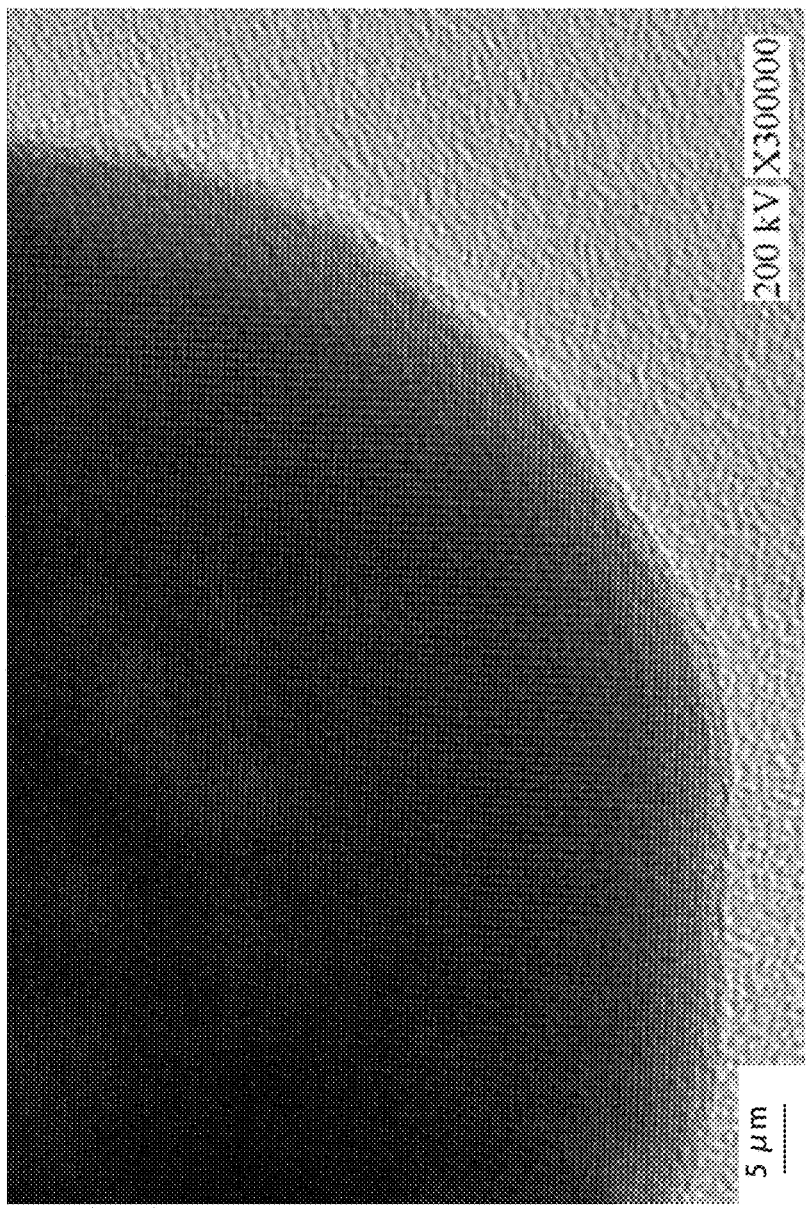

Please refer to FIG. 10A and FIG. 10B. FIG. 10A and FIG. 10B schematically illustrate the TEM analysis diagram of the battery composite material prepared by further steps of the preparation method of the battery composite material of the present invention with the first precursor. As shown in FIG. 10A and FIG. 10B, through the embodiments mentioned above, the lithium ferric manganese phosphate prepared by further steps of the preparation method of the battery composite material of the present invention with the first precursor is analyzed through TEM, and the TEM diagrams captured under magnifications of 150000× and 300000× are respectively shown as FIG. 10A and FIG. 10B.

Figure 11A:
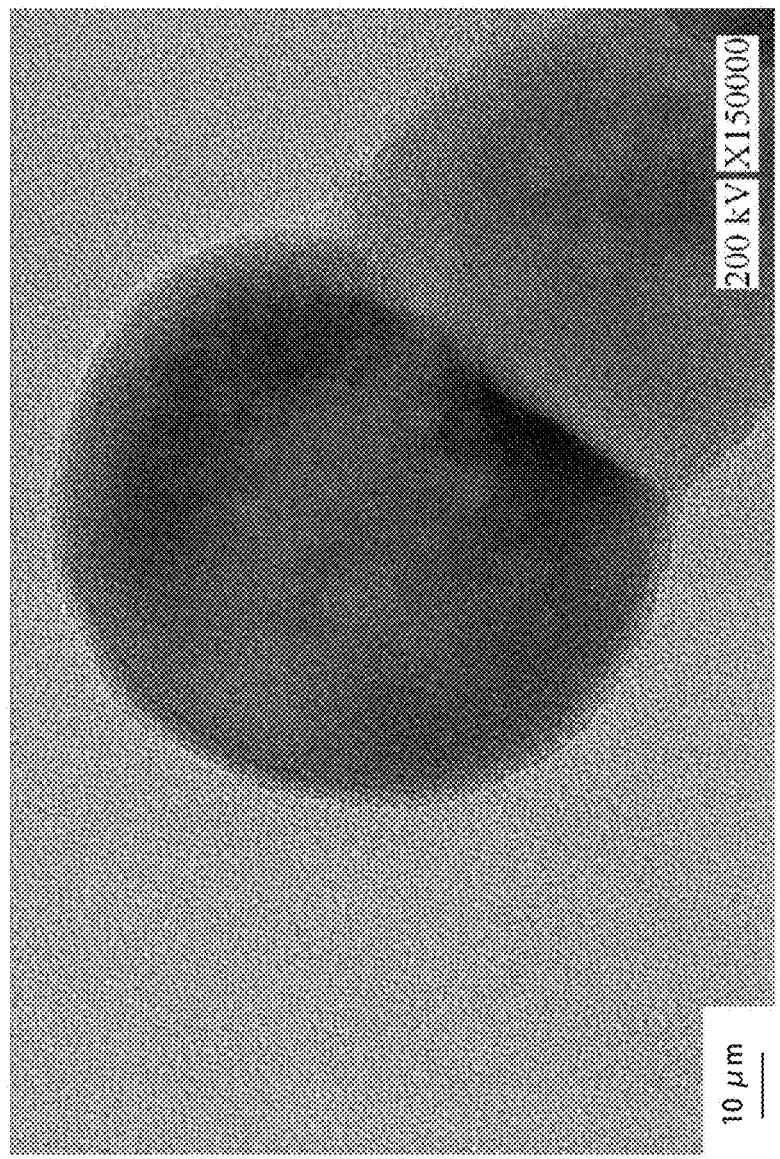
FIG. 11A and FIG. 11B schematically illustrate the TEM analysis diagram of the battery composite material prepared by further steps of the preparation method of the battery composite material of the present invention with the second precursor.
Figure 11B:
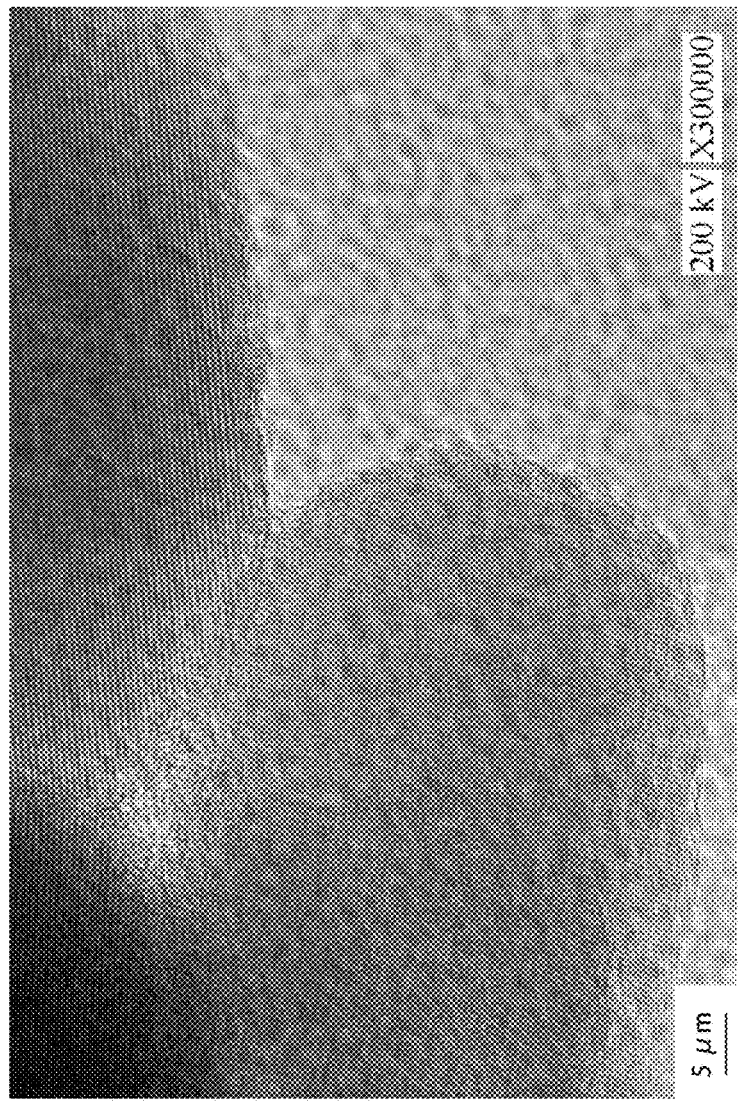

Please refer to FIG. 11A and FIG. 11B. FIG. 11A and FIG. 11B schematically illustrate the TEM analysis diagram of the battery composite material prepared by further steps of the preparation method of the battery composite material of the present invention with the second precursor. As shown in FIG. 11A and FIG. 11B, through the embodiments mentioned above, the lithium ferric manganese phosphate prepared by further steps of the preparation method of the battery composite material of the present invention with the second precursor is analyzed through TEM, and the TEM diagrams captured under magnifications of 150000× and 300000× are respectively shown as FIG. 11A and FIG. 11B.

From the above description, the present invention provides a preparation method of a battery composite material and a precursor thereof for reducing the number of times of reduction-oxidation reactions in manner of preparing the battery composite material through the precursor produced via reactions, so that the stability of the manufacturing processes is enhanced, and the difficulty of the manufacturing processes is reduced. Furthermore, by preparing a solid-solution including first metal and second metal as a precursor for finally producing a battery composite material, the battery composite material and the battery product have two stable charging and discharging platforms, such that the advantages of enhancing the stability and the electric performance are achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A preparation method of a battery composite material, comprising steps of:
   (a) providing phosphoric acid, a first metal source, a second metal source and water, wherein the formula of the phosphoric acid is written by $H_3PO_4$, the first metal source is a ferric source, the second metal source is a manganese source, and the formula of the ferric source is written by $Fe_7(PO_4)_6$;
   (b) processing a reaction of the first metal source, the second metal source, the phosphoric acid and the water to produce a first product;
   (c) calcining the first product to produce a first precursor or a second precursor, wherein each of the first precursor and the second precursor is a solid-solution containing first metal and second metal, and the formula of the first precursor and the second precursor is written by $(Mn_xFe_{1-x})_2P_2O_7$, and wherein x is greater than or equal to 0.5, and is less than or equal to 0.95; and
   (d) processing a reaction of the first precursor or the second precursor, and at least a first reactant to obtain a reaction mixture, and then calcining the reaction mixture to produce the battery composite material, wherein the formula of the battery composite material is written by $LiMn_xFe_{1-x}PO_4$.

2. The preparation method according to claim 1, wherein the first reactant is lithium hydroxide, and the formula of which is written by LiOH.

3. The preparation method according to claim 1, wherein the step (b) further comprises sub-steps of:
   (b1) allowing a first quantity of the water to dissolve a second quantity of the first metal source and a third quantity of the phosphoric acid to produce a first solution; and
   (b2) processing a reaction of the first solution and the second metal source and waiting for at least a first time period to produce the first product.

4. The preparation method according to claim 3, wherein the weight ratio of the first metal of the second quantity to phosphoric acid of the third quantity is 1:1.

5. The preparation method according to claim 3, wherein the first quantity is 5 liters, the second quantity is 904.9 grams, the third quantity is 2772.7 grams, and the first time period is 8 hours.

6. The preparation method according to claim 1, wherein the step (c) further comprises a sub-step of:
   (c1) calcining the first product in air atmosphere to produce the first precursor; or
   (c2) calcining the first product in a protective atmosphere to produce the second precursor.

7. The preparation method according to claim 6, wherein the protective atmosphere is a nitrogen atmosphere or an argon atmosphere.

8. The preparation method according to claim 6, wherein the first precursor and the second precursor are ferric manganese pyrophosphate.

9. The preparation method according to claim 1, wherein the step (d) further comprises sub-steps of:
   (d1) mixing at least the first reactant, and the first precursor or the second precursor;
   (d2) performing a high-temperature calcination; and
   (d3) producing the battery composite material.

10. The preparation method according to claim 9, wherein the high-temperature calcination is processed in an environment with temperature greater than 500° C.

* * * * *